United States Patent [19]
Wilpert et al.

[11] Patent Number: 6,159,645
[45] Date of Patent: Dec. 12, 2000

[54] BLACK MATRIX IN COLOR PICTURE TUBES AND A PROCESS FOR PRODUCING SAID BLACK MATRIX

[75] Inventors: André Wilpert; Gabi Grützner; Kerstin Schulze-Matthäi; Jürgen Bendig; Klaus Tümmel, all of Berlin, Germany

[73] Assignee: Samsung Display Devices Co., Ltd., Kyungki-Do, Rep. of Korea

[21] Appl. No.: 08/913,701

[22] PCT Filed: Jan. 21, 1997

[86] PCT No.: PCT/EP97/00268

§ 371 Date: Feb. 9, 1998

§ 102(e) Date: Feb. 9, 1998

[87] PCT Pub. No.: WO97/27608

PCT Pub. Date: Jul. 31, 1997

[30] Foreign Application Priority Data

Jan. 24, 1996 [DE] Germany ............................ 196 04 025
Apr. 19, 1996 [DE] Germany ............................ 196 17 118

[51] Int. Cl.[7] .............................. H01J 9/227; H01J 29/28
[52] U.S. Cl. .................................................. 430/25; 430/28
[58] Field of Search .................................. 430/25, 28, 7, 430/270.1

[56] References Cited

U.S. PATENT DOCUMENTS

| | | |
|---|---|---|
| 4,273,842 | 6/1981 | Nonogaki et al. . |
| 4,590,138 | 5/1986 | Lambert et al. . |
| 5,214,542 | 5/1993 | Yamasita et al. ........................ 359/891 |

FOREIGN PATENT DOCUMENTS

| | | |
|---|---|---|
| 0077976 | 5/1983 | European Pat. Off. . |
| 0091163 | 10/1983 | European Pat. Off. . |
| 0483693 | 5/1992 | European Pat. Off. . |
| 3142261 | 5/1983 | Germany . |
| 57-191632 | 11/1982 | Japan . |
| 6-230215 | 8/1994 | Japan . |
| 7-261015 | 10/1995 | Japan . |

OTHER PUBLICATIONS

Translated abstract of 07261015, published Oct. 13, 1995 "Dyestuff for Black Matrix, Resist Composition Containing That Dyestuff, Production Method of Black Matrix Using That Composition and Black Matrix Obtained by That Method" *Patent Abstracts of Japan.*

*Primary Examiner*—John A. McPherson
*Attorney, Agent, or Firm*—Leydig, Voit & Mayer, Ltd.

[57] ABSTRACT

The invention relates to a black matrix in color picture tubes, a positive photoresist composition, an agent for protecting a black matrix, and a process for producing said black matrix. The invention is based on the object of providing a black matrix produced using a positive photoresist composition which permits good capability of structuring between exposed and non-exposed areas, and reducing the process for producing the black matrix to a few technological steps. Said object is achieved by means of a black matrix consisting of a light-absorbing matrix, which may be produced from a positive photoresist composition consisting of a suspension including one or more compounds which indirectly or directly release gaseous compounds on exposure to light, a black pigment and suspension-stabilizing and wetting-promoting and/or adhesion-promoting additives; and an agent for protecting the light-absorbing matrix, which may be produced from a negative photoresist composition consisting of a water-soluble organic polymer, a crosslinking actinic component, an alkyl silicate and water, said agent having a pH value of between 6 and 7.5.

28 Claims, No Drawings

BLACK MATRIX IN COLOR PICTURE TUBES AND A PROCESS FOR PRODUCING SAID BLACK MATRIX

TECHNICAL FIELD

The invention relates to a black matrix in color picture tubes, a positive photoresist composition, an agent for protecting a light-absorbing matrix, and a process for producing said black matrix.

BACKGROUND OF THE INVENTION

The black matrix which is applied to the interior surface of color picture tubes improves the contrast performance of color television pictures. On their interior surface, these color picture tubes which are also referred to as black matrix tubes, have a striped structure characterized by alternating light-absorbing stripes and light-transmitting stripes. As a rule, these stripes are arranged vertically, as viewed from the position of an observer. The width of the absorbing and transmitting stripes ranges from 150 to 190 μm.

To date, such a matrix is produced in a multistep process using negative photoresist materials. The negative photoresist materials are coated on the interior surface of the picture tube and dried. This is followed by stripe exposure using a mask, and a developing process, after which the non-exposed negative photoresist stripes remain. Subsequently, a colloidal suspension of carbon black or graphite is coated on the interior surface of the color picture tube.

Then, in a further processing step, the remaining negative photoresist stripes, together with the graphite or carbon black coating are removed so that, when the process is completed, stripe-shaped carbon black or graphite layers, alternating with light-transmitting stripes, are formed.

Such a two-step process (negative-positive process) involves high technological input and requires providing both a photoresist and a graphite or carbon black dispersion. The relatively large number of single processing steps which, in particular, may affect the peripheral zones of the stripes, may also give rise to the phenomenon of blurring in the peripheral zones of the stripes.

EP 91 163 describes a positive-working composition which is used for the production of a light-absorbing matrix in color picture tubes. The positive-working photoresist composition essentially consists of hydrolyzed poly(vinyl alcohol), ammonium trioxalatoferrate, ferric nitrate, and finely dispersed graphite or carbon black, with the mentioned ingredients being dispersed in water. This suspension is coated on the interior surface of the screen of the color picture tube, dried and exposed to UV radiation as appropriate for the structure required.

DE 31 42 261 A1 reports a process for producing a black matrix layer between the luminous surfaces on the inside of the troughs of color picture tubes. Therein as well, a photosensitive lacquer (positive resist) is coated on the inside of the screen after cleaning. The lacquer contains poly(vinyl alcohol) and poly(methyl acrylate) as film-forming components as well as a dichromate sensitizer, with graphite being contained as black pigment. After appropriate exposure and development the exposed areas are completely removed to form a positive image of the black matrix layer.

As this photoresist composition is a positive-working one, it is sufficient to remove the areas rendered water-soluble by the exposure from the surface in a subsequent developing process.

It appeared, however, that the known positive photoresist compositions used in the production of a black matrix suffer from various drawbacks. The solubility difference between the light-absorbing portions remaining on the glass surface and the areas to be removed is very small, so that removal of the non-exposed layer areas can be observed as well, resulting in a deterioration of absorbing properties and edge definition of the black matrix. This relatively small differentiation in solubility becomes even more unfavorable if light from the exterior inadvertently interferes with the process.

The invention is based on the object of providing a black matrix produced using a positive photoresist composition which permits good capability of structuring between exposed and non-exposed areas, and reducing the process for producing the black matrix to just a few technological steps.

SUMMARY OF THE INVENTION

The present invention may be directed to a black matrix in color picture tubes, consisting of a light-absorbing matrix. The light-absorbing matrix may be produced from a positive photoresist composition comprising a suspension and a protective agent. The suspension includes one or more compounds which indirectly or directly release gaseous compounds on exposure to light, a black pigment, and suspension-stabilizing, wetting-promoting and/or adhesion-promoting additives. The agent for protecting the light-absorbing matrix comprises a water-soluble organic polymer, a crosslinking actinic component, an alkyl silicate, and water. The agent has a pH value of between about 6 and about 7.5.

The present invention may also be directed to a positive photoresist composition for the production of a black matrix in color picture tubes. The composition comprises a suspension which comprises one or more compounds which indirectly or directly release gaseous compounds on exposure to light, a black pigment, and suspension-stabilizing, wetting-promoting and/or adhesion-promoting additives.

Still, the present invention may be directed to an agent for the protection of a black matrix in color picture tubes. The protective agent has a pH value of between about 6 and about 7.5 and is produced using a negative photoresist composition. The composition comprises a water-soluble, organic polymer, a chromium salt, an alkyl silicate, and water.

Further, the present invention may be directed to a process for producing a light-absorbing matrix in color picture tubes by coating the interior screen surface with a photoresist composition. The process comprises coating the interior screen surface with a photoresist composition to form a layer, drying the layer, exposing the layer to light having a wavelength of between 250 and 450 nm for structural exposure, developing the layer using water having a temperature of from about 40 to about 80° C. to form a matrix, drying the formed matrix, and coating the matrix with a protective layer.

The invention offers various advantages.

It is possible to significantly reduce the number of technological steps in the production of a so-called black matrix. Furthermore, good compatibility is achieved when using the positive photoresist composition of the invention and current processing technology. The matrix has excellent edge definition and high optical density. The quality of structuring between exposed and non-exposed areas of the matrix is excellent. A protective coating prevents the quality of the black stripes of the matrix from being affected or destroyed during further processing of the black matrix tubes by photochemical reactions which might impair the light-absorbing effect.

Embodiments of the invention are advantageous and preferably use polyhydroxystyrene. The use of polyhydroxystyrene in the composition has excellent layer formation properties. By conversion into the virtually water-insoluble t-butoxycarbonylpolyhydroxystyrene (Boc-PHS) the Boc-PHS can be used as an aqueous suspension. Since Boc-polyhydroxystyrene is acid-sensitive, it is possible, by adding photoinitiators on the basis of onium salts and under the influence of UV irradiation, to accomplish removal of the Boc group due to the liberation of acid, so that the polyhydroxystyrene regains water solubility to some extent. According to the invention, it is preferably to maintain the positive photoresist composition at a pH value around neutrality so as not to interrupt the reaction progress of the acid-catalyzed Boc group removal. Therefore, a preferred operation for proper performance of the composition according to the invention is steady control of the pH value both in production and application in the technological process.

According to the invention, compounds releasing gases at wavelengths ranging from 250 to 450 nm are suggested for the positive formation of the light-absorbing matrix.

By adding a suitable developing step, the required structuring of the matrix is achieved. The effect may be enhanced by solubility changes additionally occurring during UV exposure.

In order to obtain said effects, photosensitive polymers as well as polymers in combination with photosensitive components may be employed.

According to the invention, compounds which can be use to include compounds which release nitrogen, carbon dioxide, hydrocarbons, oxygen, or aldehydes as a result of exposure to light.

The compounds releasing nitrogen especially include azides and bisazides such as 4,4'-diazidostilbene-2,2'-disulfonic acid or salts thereof, p-nitrophenyl azide, acyl azides such as naphthoyl azide, diazides such as benzoquinone diazides, naphthoquinone diazides, azo and/or diazocompounds such as azobisisobutyronitrile, phenylazotriphenylmethane, N,N'-azocarbazole, heterocycles containing at least 2 adjacent nitrogen atoms such as triazoles, tetrazoles, sydnones, triazolones and thiadiazoles, diazirines such as cyclohexane diazirine as well as diazonium salts, e.g., substituted benzenediazonium salts.

Among the $CO_2$-releasing compounds which may advantageously be used, there may be mentioned dioxazolones or oxazolones such as 2-oxo-5-(2,4,6-trimethylphenyl)-1,3,4-dioxazole, peroxycarboxylic acids or esters thereof such as tert-butyl peracetate, diacyl peroxides such as dibenzoyl peroxide and phthaldioyl peroxide, photo-decarboxylatable carboxylic acids such as phenylmercaptoacetic acid and pyridylacetic acid and carbonic esters and carbonic derivatives such as tert-butoxycarbonyloxy aromatic compounds.

Among the oxygen-releasing compounds, there may be mentioned hydroperoxides and peroxides such as tert-butyl-hydroperoxide, di-tert-butylperoxide and anthracene endoperoxide, dioxetanes such as adamantane dioxetane adamantane and ozonides.

Among the compounds releasing aldehydes when exposed to light, especially polyoxymethylenes or the corresponding copolymers or co-condensates are suitable according to the invention.

Among the substances releasing hydrocarbons, alkyl aryl carbonates, particularly tert-butoxycarbonyloxyphenols may be used.

Containing insoluble compounds and also black pigments, the positive photoresist composition, are preferably in the form of a suspension, which form is also used for coating the inside of the screen. Water has proven to be a particularly advantageous suspending agent. However, it is possible to use the water in admixture with organic solvents, or to use purely organic solvents. To this end, water-soluble alcohols and esters as well as multivalent alcohols and esters thereof are particularly suitable as are water-soluble ketones such as acetone.

Advantageously, the positive photoresist composition according to the invention contains suspension-stabilizing and/or adhesion-promoting additives.

Preferably, the composition includes a surface-active material in addition to the suspended polymer and black pigment which prevents the exceedingly small polymer and pigment particles from aggregating to larger particles, thus limiting the stability of the suspension. As a rule, per se known stabilizers from the group of ionic and non-ionic surface-active materials are added.

In addition, wetting-promoting additives are contained which are per se known and similarly, are selected from the group of non-ionic and ionic surface-active materials.

As the positive photoresist composition according to the invention is intended to be coated on the interior glass surface of a screen body, to form a light-absorbing matrix, it is preferable to add adhesion-promoting substances to the photoresist, which permit sufficiently firm bonding between the suspension of the invention and the glass surface, particularly after drying. The per se known alkoxysilanes such as, e.g., N-($\beta$D-aminoethyl)-$\gamma$-aminopropyltrimethoxysilane, are advantageously suited for this purpose.

The suspension-stabilizing and wetting-promoting, as well as the adhesion-promoting additives are contained at very low concentrations in the positive photoresist composition according to the invention. Substantially, the concentration of the suspension-stabilizing, surface-active materials depends on the size of the black pigment particles and their concentration.

The unexposed positive photoresist forming the light-absorbing matrix on the inside of the screen is preferably present in full reactivity. Since in the course of the color picture tube production, further UV exposures, during the subsequent production of the luminescent material stripes, for example, and temperature processes for drying are necessary, the positive photoresist rendered water-soluble by UV exposure may cause destruction of the matrix structure through subsequent action of water in context with the development of the luminescent material stripes. According to the invention, in the final production of the black matrix, a water-insoluble protective layer is therefore coated after developing and drying the light-absorbing matrix. According to the invention, this is accomplished using an agent for protecting a matrix, which, according to its nature, is a photoresist. After coating this layer on the black stripes to completely cover same, the agent according to the invention is made water-insoluble by UV exposure, thus preventing removal of the black stripes.

Adjustment to viscosity, layer thickness and sensitivity is always possible by varying the concentrations of ingredients of the agent according to the invention. Photocuring of the coated agent is effected using UV light ranging from 300 to 450 nm, by uniform exposure of the entire interior surface of the screen part covered by said agent. The protective layer thus created completely covers the matrix structures, protecting them against the action of liquids and suspensions used for producing the layer of luminescent material, which normally might cause a change or destruction of the matrix structure in the further process of screen production.

In summary, the process of the invention for producing a black matrix in color picture tubes is characterized by the following partial steps:

Coating the interior screen surface with the photoresist of the invention by spin coating, spray coating or other suitable methods.

Drying the resist layer using infrared radiation.

If necessary, pre-exposing the entire coated and dried resist layer using UV ranging from 300 to 450 and employing an Hg high pressure lamp or a Xenon high pressure lamp.

If necessary, subjecting the resist layer to a postbake process.

Developing the matrix structure with water at a pH value of preferably 7–12, wherein the developing temperature may be preferably up to 80° C. During the developing process, the developing solution can be coated uniformly on the inside of the screen, spread by rotating the screen portion and centrifuged off.

Drying the obtained matrix using infrared radiators and/or air drying with, for example, warm air.

Coating a protective layer by, for example, spin coating, drying and exposing to UV.

In the following embodiments, the invention will be illustrated in more detail.

EXAMPLE 1

50 g of a graphite suspension having a solids content of 10% by weight is mixed with 0.4 g of diphenyliodonium tetrafluoroborate with stirring and titrated to a pH value of 7±0.5 using a 1% aqueous solution of p-toluenesulfonic acid. Then, 61 g of an aqueous suspension having a solids content of 14.3% by weight of hydrophilized poly(p-hydroxystyrene-Boc) with a Boc level of about 98% is added with vigorous stirring and/or in an ultrasonic bath, and the mixture is homogenized. Using the thus obtained black-pigmented photoresist, homogenous layers having a layer thickness of 1.2 μm are produced on the interior screen surface of a color picture tube. The layers are dried for 1 min at 60° C., and this is followed by exposure using an extra-high pressure mercury lamp (HBO 500) at 2–5 mJ/cm². The exposed layers are developed for 30 s using hot water at 60° C. Subsequently, the structure-coated substrates are centrifuged to dryness.

EXAMPLE 2

25 g of a graphite suspension having a solids content of 10% by weight is mixed with 0.2 g of triphenylsulfonium hexafluoroantimonate with stirring and titrated to a pH value of 7±30.5 using a 1% aqueous solution of p-toluenesulfonic acid. Then, 30 g of an aqueous suspension having a solids content of 14.3% by weight of hydrophilized poly(p-hydroxystyrene-Boc) with a Boc level of about 98% is added with vigorous stirring and/or in an ultrasonic bath, and the mixture is homogenized. Using the thus obtained black-pigmented photoresist, homogenous layers having a layer thickness of 1.3 μm are produced on the interior screen surface of a color picture tube. The layers are dried for 1 min at 60° C., and this is followed by exposure using an extra-high pressure mercury lamp (HBO 500) at 2–5 mJ/cm². The exposed layers are developed for 25 s using hot water at 60° C. Subsequently, the structure-coated substrates are centrifuged to dryness.

EXAMPLE 3

40 g of a graphite suspension having a solids content of 10% by weight is mixed with 2.3 g of a 1% solution of an onium salt photoinitiator with stirring and titrated to a pH value of 7±0.5 using a 1% aqueous solution of p-toluenesulfonic acid. Then, 49 g of an aqueous suspension having a solids content of 14.3% by weight of hydrophilized poly(p-hydroxystyrene-Boc) with a Boc level of more than 98% is added with vigorous stirring and/or in an ultrasonic bath, and the mixture is homogenized. Using the thus obtained black-pigmented photoresist, homogenous layers having a layer thickness of 1.5 μm are produced on the interior screen surface of a color picture tube. The layers are dried for 1 min at 60° C., and this is followed by exposure using an extra-high pressure mercury lamp (HBO 500) at 2–5 mJ/cm². The exposed layers are developed using hot water at 60° C. Subsequently, the coated substrates are centrifuged to dryness. Under process conditions, it is important that the positive photoresist composition is homogenized uniformly to prevent sedimentation of the suspended particles.

EXAMPLE 4

3.56 kg of polyvinylpyrrolidone (K90) is dissolved in 50 l of water with exceedingly vigorous stirring. Thereafter, 0.75 kg of diazidostilbenedisulfonic acid (DAS) is added. Using sodium hydroxide, the pH value is adjusted to 7.5. To this mixture a graphite suspension is added with vigorous stirring. After 48 hours the black-pigmented positive photoresist is homogenized in an ultrasonic bath. Layers having a thickness of 1.2 μm are produced on the interior screen surface of a color picture tube. Exposure is effected at 2–5 mJ/cm² using an extra-high pressure mercury lamp (HBO 500). Development is carried out using hot water at 60° C. Subsequently, the structured substrate is centrifuged to dryness.

EXAMPLE 5

50 kg of a graphite suspension is added to 50 kg of a commercially available NONCHRON type photoresist with stirring. After 48 hours the mixture is stirred up in an ultrasonic bath. Using the thus obtained black pigmented positive photoresist, homogenous layers having a thickness of 1 μm are produced on the interior screen surface of a color picture tube. The layers are dried at 60° C. for 1 minute and subsequently, exposure is effected at 2–5 mJ/cm² for 15 s using an extra-high pressure mercury lamp (HBO 500). The exposed screens are developed in hot water at 60° C. for 35 s. Subsequently, the structured substrate is centrifuged to dryness.

EXAMPLE 6

15.0 g of the p-diazonium diphenylamine resin of formula A

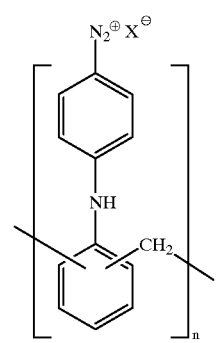

A wherein X=[ZnCl₃]⁻ and n=7 . . . 12, is dissolved in 200 ml of water. To this mixture 250 ml of a 10 wt.-% graphite suspension is added with vigorous stirring. After 12 hours of intense stirring, the suspension is subjected to a Turrax homogenization (10,000 min⁻¹) for 20 minutes. Layers having a thickness of 1.0 to 1.5 μm are produced on glass by spin coating the black-pigmented resist. Exposure is effected at 2–5 mJ/cm² using an extra-high pressure mercury lamp (HBO 500). Development is carried out for 10 s using warm water at 40° C. The structured glass substrate is dried.

EXAMPLE 7

10 g of the p-diazonium diphenylamine resin of formula A wherein X=$[ZnCl_3]^-$ and n=7 . . . 12, and 5 g of polyvinylpyrrolidone are dissolved in 200 ml of water. To this mixture 250 ml of a 10 wt.-% graphite suspension is added with vigorous stirring. After 12 hours of intense stirring, the suspension is subjected to a Turrax homogenization (10,000 $min^{-1}$) for 20 minutes. Layers having a thickness of 1.0 to 1.5 μm are produced on glass by spin coating the black-pigmented resist. Exposure is effected at 2–5 $mJ/cm^2$ using an extra-high pressure mercury lamp (HBO 500). Development is carried out for 10 s using warm water at 40° C. The structured glass substrates are dried.

Protective coatings are applied onto the matrix structures produced as described in the Examples 1–7.

EXAMPLE 8

To 150 g of demineralized water 2.1 g of a 8.5 wt.-% PVA-Moviol 40–88 solution is added with stirring. After stirring the PVA solution, 5 ml of a 1 wt.-% ammonium dichromate (ADC) solution is added with stirring. To this PVA/ADC solution 1 ml of a freshly prepared solution of 1.7 g ethyl silicate in 100 ml of demineralized water is added which is followed by addition of 50 ml of demineralized water and stirring for 15 minutes. This precoating solution is applied onto the matrix structure pre-wetted with water, which is followed by centrifugation and drying. The precoating is photocured using UV light at 0.5–3 $mJ/cm^2$.

EXAMPLE 9

By dissolving polyvinylpyrrolidone K90 (PVP) in demineralized water a 6 wt.-% solution is prepared. By dissolving diazidostilbenedisulfonic acid disodium salt (DAS) in demineralized water a 3 wt.-% solution is prepared.

In order to prepare a precoating solution 37 g of PVP solution (6 wt.-%), 7 g of DAS solution (3 wt.-%), and 63 g of demineralized water are stirred for 30 minutes, which is followed by addition of 900 ml of demineralized water with stirring.

Thereafter, 10 ml of a 1.7 wt.-% ethyl silicate solution is added, and stirring is continued for 15 minutes.

This precoating solution is applied onto the matrix structure pre-wetted with water, which is followed by centrifugation and drying. The precoating is photocured using UV light at 0.5–5 $mJ/cm^2$.

What is claimed is:

1. A black matrix in color picture tubes, comprising a light-absorbing matrix, produced from a positive photoresist composition comprising a suspension which includes one or more compounds which indirectly or directly release gaseous compounds on exposure to light, a black pigment, and suspension-stabilizing, wetting-promoting and/or adhesion-promoting additives; and an agent for protecting the light-absorbing matrix, produced from a negative photoresist composition comprising a water-soluble organic polymer, a crosslinking actinic component, an alkyl silicate, and water, said agent having a pH value of between about 6 and about 7.5.

2. The black matrix of claim 1, wherein the compounds which release gaseous compounds on exposure to light can be transformed into a positive relief.

3. The black matrix of claim 1 wherein the gas-releasing compounds include polymers or polymers in combination with photosensitive compounds.

4. The black matrix of claim 1, wherein the released gases include $N_2$, $CO_2$, $O_2$, aldehydes and/or hydrocarbons.

5. The black matrix of claim 4, wherein the nitrogen-releasing compounds include azides, bisazides, diazides, azo and diazo compounds, heterocycles having at least two adjacent nitrogen atoms, diazirines and/or diazonium salts.

6. The black matrix of claim 4, wherein the compounds releasing carbon dioxide include oxazolones, dioxazolones, peroxycarboxylic acids or esters thereof, diacyl peroxides, photo-decarboxylatable carboxylic acids, carbonic esters and/or carbonic derivatives.

7. The black matrix of claim 4, wherein the compounds releasing oxygen include organic hydroperoxides, organic peroxides, dioxetanes and/or ozonides.

8. The black matrix of claim 4, wherein the compounds releasing aldehydes include polymethylenes or corresponding copolymers or co-condensates.

9. The black matrix according to claim 4, wherein the compounds releasing $CO_2$ and hydrocarbons include Boc-substituted, polymeric phenols or phenol resins.

10. The black matrix of claim 1, wherein the compounds which indirectly or directly release gaseous compounds on exposure to light have film-forming properties.

11. The black matrix of claim 1, further comprising film-forming polymers or polymer dispersions.

12. The black matrix of claim 1, further comprising water and/or organic solvents.

13. The black matrix of claim 1, wherein the suspension further includes a hydrophobized polyhydroxystyrene, and an onium salt photoinitiator absorbing light having wavelengths between 250 and 450 nm.

14. The black matrix of claim 13, comprising from about 4 to about 15% by weight of the hydrophobized polyhydroxystyrene having a hydrophobization level of at least about 75%, from about 1.5 to about 8% by weight of the black pigment, at least about 0.01% by weight of the onium salt photoinitiator absorbing light having wavelengths between 250 and 450 nm in an aqueous dispersing agent.

15. The black matrix of claim 13, wherein the onium salt photoinitiator comprises diaryliodonium and/or triarylsulfonium salts.

16. The black matrix of claim 13, wherein the hydrophobized polyhydroxystyrene comprises alkoxycarbonylpolyhydroxystyrene or aryloxycarbonylpolyhydroxystyrene.

17. The black matrix of claim 13, wherein the hydrophobized polyhydroxystyrene comprises t-butoxycarbonylpolyhydroxystyrene.

18. The black matrix of claim 13, wherein the hydrophobized polyhydroxystyrene comprises t-butoxycarbonylpoly (p-hydroxystyrene).

19. The black matrix of claim 13, wherein the polyhydroxystyrene has an alkylation level of 0–100%.

20. The black matrix of claim 14, wherein the polyhydroxystyrene has a hydrophilization level of 0–50%.

21. The black matrix of claim 1, wherein the suspension further includes surfactants and polyvinylpyrrolidone, and wherein the one or more compounds includes a 4,4'-diazidostilbene-2,2'-disulfonic acid disodium salt.

22. The black matrix of claim 21, comprising from about 1 to about 8% by weight of polyvinylpyrrolidone having a K value of from 60 to 120, from about 1 to about 8% by weight of a black pigment, from about 0.1 to about 3% by weight of the 4,4'-diazidostilbene-2,2'-disulfonic acid disodium salt, and up to about 2% by weight of additives.

23. The black matrix of claim 21, wherein prior to being incorporated in the photoresist, the black pigment is in the form of a solid or a suspension additionally containing up to 10% by weight of a polymeric binder.

24. The black matrix of claim 21, wherein the surfactants comprise salts of fatty acids.

25. A process for producing a light-absorbing matrix in color picture tubes by coating the interior screen surface with a photoresist composition, comprising coating the interior screen surface with a photoresist composition comprising a suspension which comprises one or more compounds which indirectly or directly release gaseous compounds on exposure to light, a black pigment, and suspension-stabilizing, wetting-promoting and/or adhesion promoting additives to form a layer, drying the layer, exposing the layer to light having a wavelength of between 250 and 450 nm for structural exposure, developing the layer using water having a temperature of from about 40 to about 80° C. to form a matrix, drying the formed matrix, and coating the matrix with a protective layer.

26. The process according to claim 25, further comprising pre-exposing the layer prior to exposing the layer.

27. The process according to claim 25, wherein the water has a pH value of from about 7 to about 12.

28. The process according to claim 25, further comprising treating the layer at a temperature between about 40 to about 150° C. prior to developing.

* * * * *